United States Patent
Levinski et al.

(10) Patent No.: US 10,228,320 B1
(45) Date of Patent: Mar. 12, 2019

(54) ACHIEVING A SMALL PATTERN PLACEMENT ERROR IN METROLOGY TARGETS

(71) Applicant: KLA—Tencor Corporation, Milpitas, CA (US)

(72) Inventors: Vladimir Levinski, Migdal HaEmek (IL); Daniel Kandel, Aseret (IL)

(73) Assignee: KLA—Tencor Corporation, Milpitas, CA (US)

( * ) Notice: Subject to any disclaimer, the term of this patent is extended or adjusted under 35 U.S.C. 154(b) by 725 days.

(21) Appl. No.: 14/820,917

(22) Filed: Aug. 7, 2015

Related U.S. Application Data

(60) Provisional application No. 62/035,343, filed on Aug. 8, 2014.

(51) Int. Cl.
G01N 21/01 (2006.01)
G06F 17/50 (2006.01)

(52) U.S. Cl.
CPC ............ *G01N 21/01* (2013.01); *G06F 17/50* (2013.01); *G01N 2201/068* (2013.01)

(58) Field of Classification Search
CPC ... G01N 21/01; G01N 2201/068; G06F 17/50
USPC .......................................................... 703/1
See application file for complete search history.

(56) References Cited

U.S. PATENT DOCUMENTS

| | | | |
|---|---|---|---|
| 6,794,637 B1 * | 9/2004 | Holzapfel | ......... G01D 5/34715 250/231.13 |
| 6,921,916 B2 | 7/2005 | Adel et al. | |
| 7,667,842 B2 | 2/2010 | Schulz | |
| 7,876,438 B2 | 1/2011 | Ghinovker et al. | |
| 8,250,497 B2 | 8/2012 | Hsu et al. | |
| 8,543,947 B2 | 9/2013 | Liu et al. | |
| 8,913,237 B2 | 12/2014 | Levinski et al. | |
| 9,678,421 B2 | 6/2017 | Levinski et al. | |

(Continued)

FOREIGN PATENT DOCUMENTS

| | | |
|---|---|---|
| EP | 2766923 A1 | 8/2014 |
| WO | 2013055710 A1 | 4/2013 |

(Continued)

OTHER PUBLICATIONS

U.S. Appl. No. 14/949,444, filed Nov. 23, 2015, entitled Polarization Measurements of Metrology Targets and Corresponding Target Designs, Amit et al.

(Continued)

*Primary Examiner* — Saif A Alhija
(74) *Attorney, Agent, or Firm* — Suiter Swantz pc llo

(57) ABSTRACT

Target design methods, targets as well as scanner aberration methods and device design improvements are provided. Metrology targets may be designed by identifying at least two geometric elements in a specified device design, and designing corresponding at least two target cells of an overlay metrology target to have structures related to the at least two geometric elements. Non-printed filling elements may be added to target or device designs which exhibit large spaces (e.g., larger than twice the minimal design rule pitch) in order to avoid placement error and other inaccuracies. Scanner aberrations themselves may be measured using corresponding targets as well.

17 Claims, 7 Drawing Sheets

(56) References Cited

U.S. PATENT DOCUMENTS

| | | | |
|---|---|---|---|
| 2003/0021465 A1* | 1/2003 | Adel | G03F 7/70633 |
| | | | 382/151 |
| 2009/0279091 A1 | 11/2009 | Levinski et al. | |
| 2012/0033215 A1 | 2/2012 | Kandel et al. | |
| 2013/0035888 A1 | 2/2013 | Kandel et al. | |
| 2013/0342831 A1 | 12/2013 | Levinski et al. | |
| 2014/0141536 A1 | 5/2014 | Levinski et al. | |
| 2016/0178351 A1 | 6/2016 | Amit et al. | |

FOREIGN PATENT DOCUMENTS

| | | |
|---|---|---|
| WO | 2014039689 A1 | 3/2014 |
| WO | 2014062972 A1 | 4/2014 |

OTHER PUBLICATIONS

U.S. Appl. No. 14/795,549, filed Jul. 9, 2015, entitled Target Element Types for Process Parameter Metrology, Levinski et al.

* cited by examiner

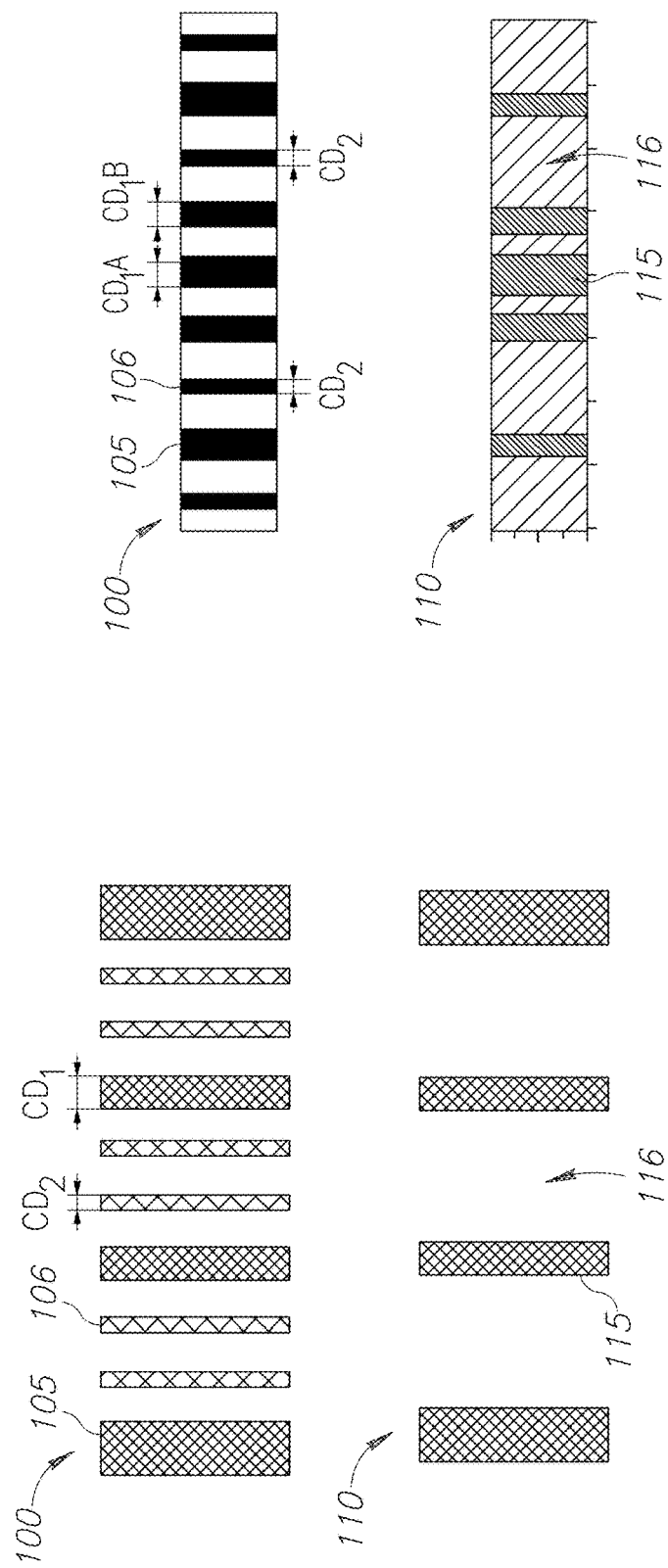

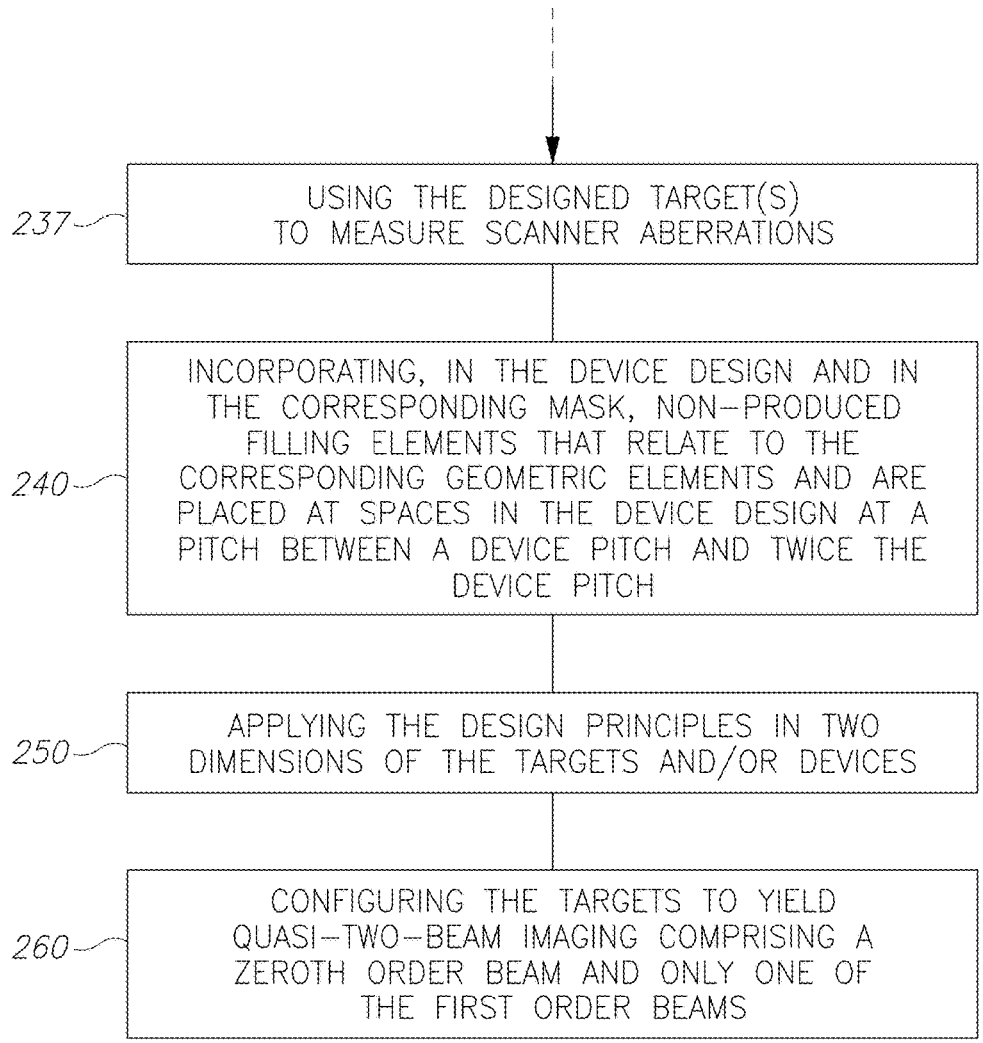
Figure 5 (cont. 1)

ACHIEVING A SMALL PATTERN PLACEMENT ERROR IN METROLOGY TARGETS

CROSS REFERENCE TO RELATED APPLICATIONS

This application claims the benefit of U.S. Provisional Patent Application No. 62/035,343 filed on Aug. 8, 2014, which is incorporated herein by reference in its entirety.

TECHNICAL FIELD

The present invention relates to the field of metrology, and more particularly, to metrology targets having a small pattern placement error.

BACKGROUND OF THE INVENTION

Metrology targets are designed to reflect device production accuracy in optical measurements of the targets. Imaging targets that comprise periodical gratings with large pitches (e.g., 1500-2500 nm) usually provide good contrast but are not process compatible and have a large pattern placement error (PPE, see below), which can reach a few nanometers. Scatterometry targets have smaller pitches (e.g., 500-800 nm) which are still an order of magnitude larger than device pitches. The gap between design rule pitches and SCOL target scales is large and PPE can be as large as in the case of imaging targets.

Pattern placement error (PPE) of the target pattern placement relative to the device pattern placement results from the current limitation of unachievable on-device overlay (OVL) metrology due the fact that the design rule pitches are unresolved by current imaging and scatterometry optical tools. Instead of on-device measurements, overlay measurements are performed on specially designed "proxy" metrology targets which have typical scales (pitches) that are larger than hundreds of nanometers (the gap between device pitch (<90 nm) and the pitch of "proxy" target increases with time). This difference in target and device scales manifests itself in pattern placement error (PPE). For example, due to scanner asymmetric aberrations, the PPE between devices and "proxy" targets may be as large as 1-2 nanometers. Accordingly, the measured OVL values should be corrected on the values of placement errors for resist and process layers which depend on a specific pair of scanners used for printing these layers and field position of the target. Such correction is an extremely difficult logistic problem which requires developing of alternative approaches for significant PPE reduction. Current metrology targets may provide good contrast and process compatibility but have a large pattern placement error, while suggested device-like targets, such as disclosed in U.S. Patent Publication No. 20110028004, which is incorporated herein by reference in its entirety, may satisfy the requirements for small PPE and process compatibility but do not provide a good contrast for OVL measurement.

U.S. Pat. No. 8,913,237, which is incorporated herein by reference in its entirety, discloses overlay targets comprising at least a plurality of a plurality of first grating structures having a course pitch that is resolvable by an inspection tool and a plurality of second grating structures positioned relative to the first grating structures. The second grating structures have a fine pitch that is smaller than the coarse pitch, and the first and second gratings have feature dimensions that all comply with a predefined design rules specification.

FIGS. 1A-1C are examples of prior art device-like targets 90 with corresponding prior art diffraction patterns. FIG. 1A schematically illustrates prior art device-like target 90 having a coarse pitch $P_c$ and a fine pitch $P_f$ (e.g., $P_c$=900 nm, $P_f$=90 nm), with varying widths of the coarse pitched elements, resulting in a produced target 93 at the coarse pitch that yields a diffraction pattern 96 (produced target 93 is illustrated as having more elements than target design 90 yet demonstrates the same principle). Such device-like targets have a small pattern placement error and are process compatible, but they do not provide enough contrast for overlay metrology measurements. FIGS. 1B and 1C schematically illustrates prior art device-like target designs 90 having perpendicular structures 91, 95 which are process compatible and improves significantly target contrast with respect to prior art device-like targets as illustrated in FIG. 1A, but do not solve the PPE problem. Simulations show that the PPE is about 3 nm nanometers for 50 m$\lambda$ amplitude of scanner asymmetric aberrations. A seen in the corresponding prior art diffraction pattern 96, the amplitudes of diffraction orders corresponding to the coarse pitch are not small and the placement of the printed pattern differs from placement of devices row.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a method, comprising identifying at least two geometric elements in a specified device design, and designing corresponding at least two target cells of an overlay metrology target to have structures related to the at least two geometric elements.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIGS. 3A-3C illustrate high level schematic examples of target designs and corresponding printed targets, according to some embodiments of the invention.

DETAILED DESCRIPTION OF THE INVENTION

Figure 1B:
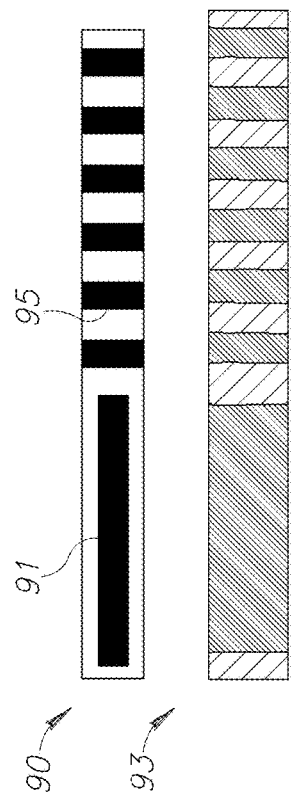
FIGS. 1A-1C are examples of prior art device-like targets with corresponding prior art diffraction patterns.
Figure 1B:
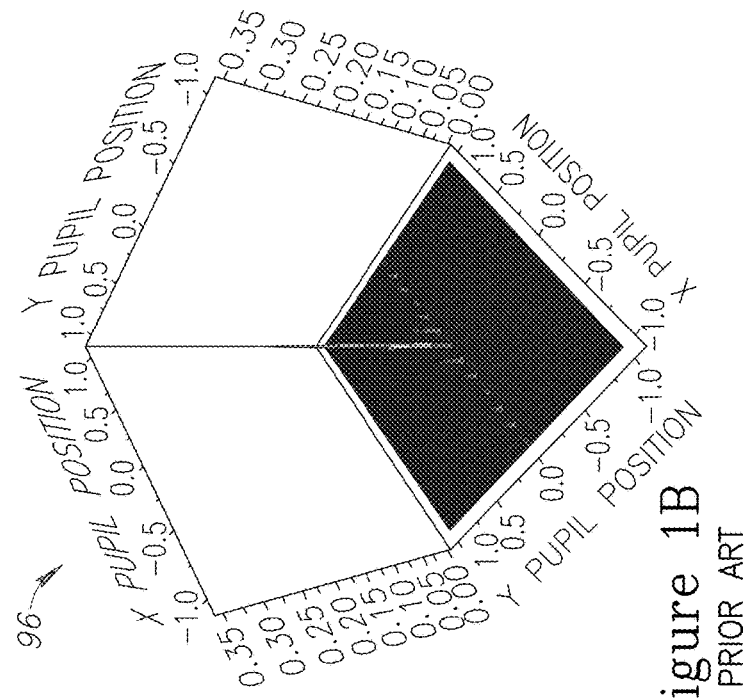

Prior to the detailed description being set forth, it may be helpful to set forth definitions of certain terms that will be used hereinafter.

The term "element" as used in this application refers to a part of a device design.

The term "geometric element" as used in this application refers to elements in the device design which have a similar shape.

The term "structure" as used in this application refers to a part of a target design.

The term "non-printed" as used in this application refers to an element of a device design or a structure of a target design which is present in the respective mask, but is not actually printed to be part of the respective device or target due to its shape and/or dimensions. For example, the element or structure may have a dimension which is below a scanner's printing threshold.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Target design methods, targets as well as scanner aberration methods and device design improvements are provided. Metrology targets may be designed by identifying at least two geometric elements in a specified device design, and designing corresponding at least two target cells of an overlay metrology target to have structures related to the at least two geometric elements. Non-printed filling elements may be added to target or device designs which exhibit large spaces (e.g., larger than twice the minimal design rule pitch) in order to avoid placement error and other inaccuracies. Scanner aberrations themselves may be measured using corresponding targets as well.

Disclosed target embodiments satisfy the following three requirements: process compatibility, measurability of the target (contrast) and small pattern placement error (relative to device pattern placement) and thus improve over prior art targets which satisfy at most two of these requirements. The present invention presents a new approach for OVL target design allowing a significant PPE reduction without compromising on-target process compatibility and target measurability (contrast). And, conversely, in the case of OVL target design based on real device configurations the new approach allows a significant contrast enhancement without pattern placement error due to change of the designed target structure.

Figures 1C, 2:
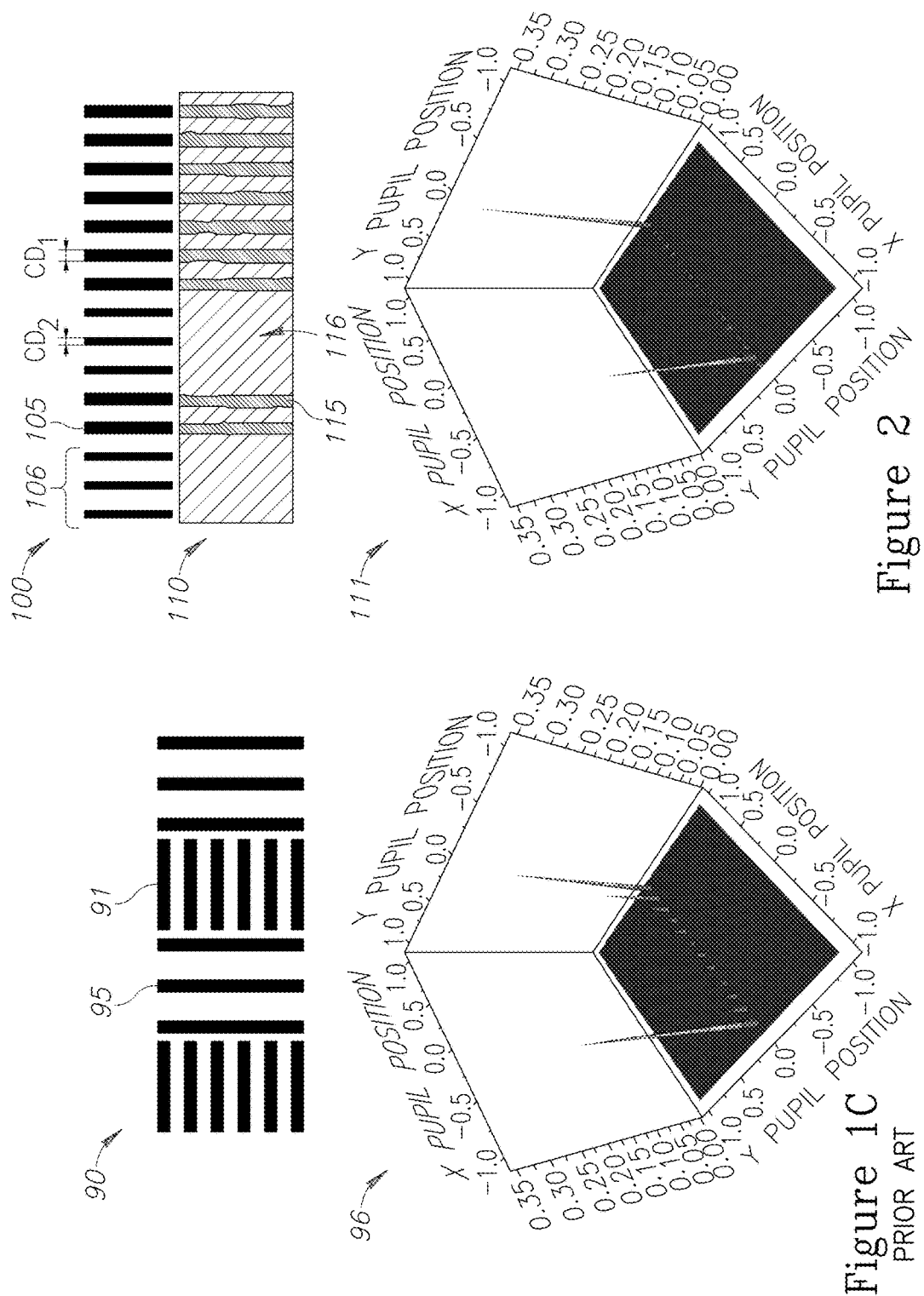
FIG. 2 is a high level schematic example of a target design, a printed target and a corresponding diffraction pattern, according to some embodiments of the invention.

FIG. 2 is a high level schematic example of a target design 100, a printed target 110 and a corresponding diffraction pattern 111, according to some embodiments of the invention. Target design 100 comprises a periodic device pattern having a design rule pitch as a starting point of "proxy" target design for OVL metrology. Target design 100 utilizes the critical dimension (CD) sensitivity of the scanner, and comprises lines 105 having CD' above the production threshold and lines 106 having $CD_2$ ($<CD_1$) below the production threshold. Due to scanner properties, a small change of CD (as a non-limiting example, i.e., $CD_1$-$CD_2$ may be small) may result in a relatively sharp boundary between printed lines 115 and non-printed lines 116. Resulting target 110 hence provides a good contrast and is process compatible, and furthermore is characterized a pattern placement which is close to the pattern placement of real devices, due to similar fine pitches of target design 100 and devices. As seen in diffraction pattern 111, the amplitudes of all diffraction orders are small apart from zero order and one first diffraction order corresponding to the design rule pitch and illustrated as the two prominent peaks resulting from the fine pitch segmentations (small peaks correspond to diffraction orders of the coarse pitch).

Figure 1A:
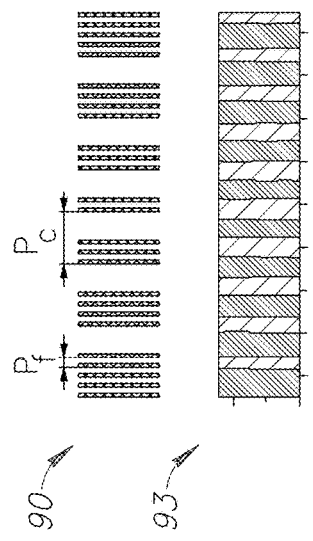
Figure 1A:
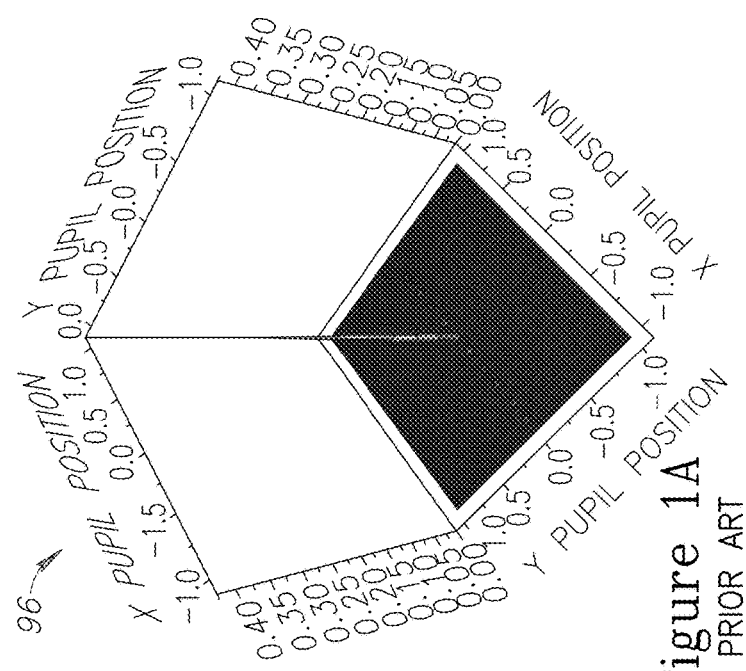

Consequently, the effect of scanner aberrations on the placement of the printed target is the same as for a periodical row of real devices. In the illustrated specific and non-limiting example, the design rule pitch is 90 nm, $CD_1$ of printed lines is 40 nm, whereas $CD_2$ of non-printed lines is 33 nm. The pattern placement error for the illustrated target is less than 0.2 nm as compared to PPE of about 3 nm for a standard BiB or AIM targets for the same amplitude of asymmetric aberrations (e.g., as illustrated in FIGS. 1A-1C).

Figure 3C:
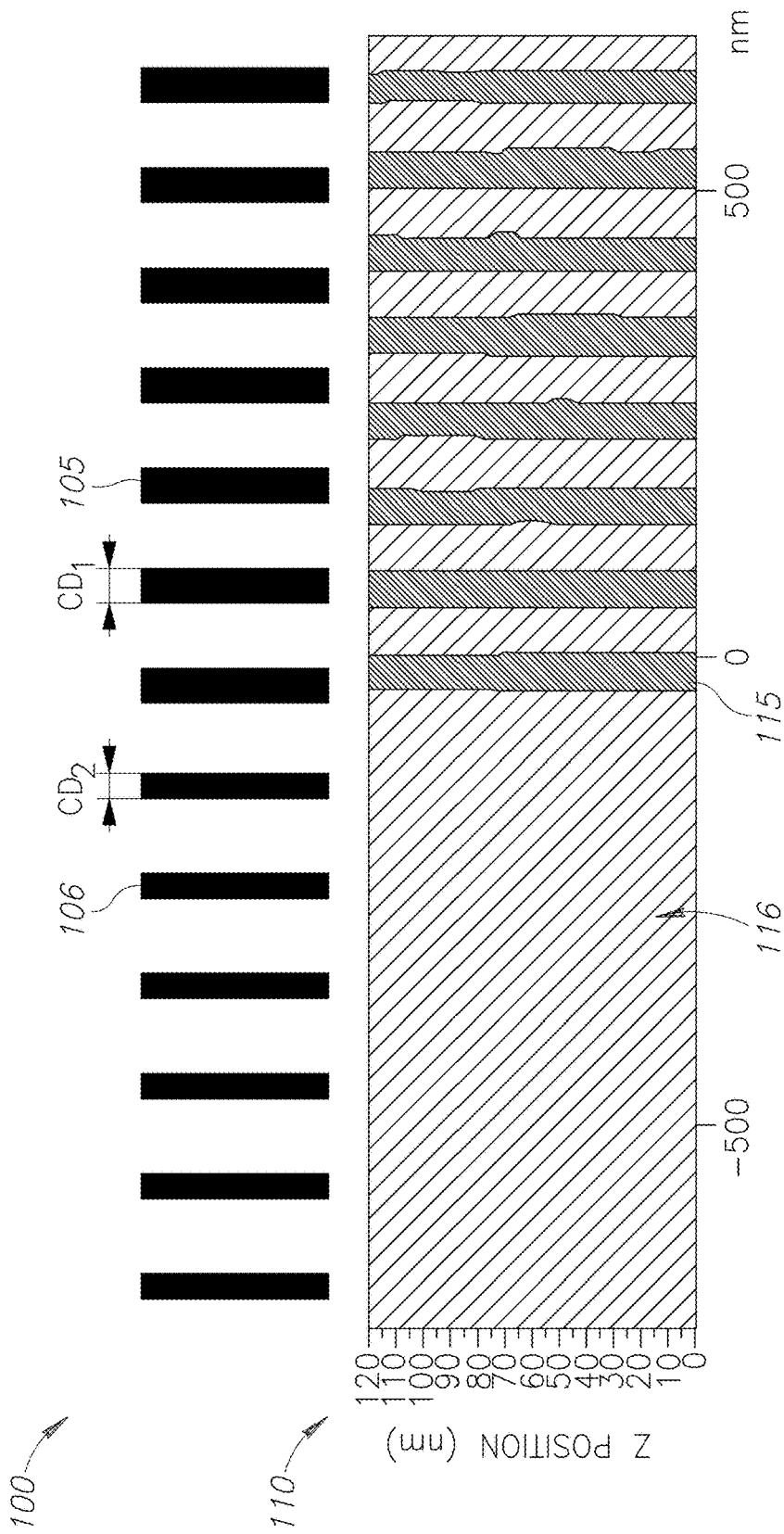

FIGS. 3A-3C illustrate high level schematic examples of target designs 100 and corresponding printed targets 110, according to some embodiments of the invention. FIG. 3A illustrates a similar example to FIG. 2, with periodic printed elements 115 having varying CDs. As illustrated in FIG. 3B, metrology target designs 100 may comprise a plurality of printed elements 105 having critical dimensions (e.g., $CD_1A$, $CD_1B$) above a printable threshold and a plurality of non-printed elements 106 having critical dimensions (e.g., $CD_2$, possibly multiple different CD's) below a printable threshold. Metrology targets 110 printed according to designs 100 comprise printed lines 115 and non-printed lines 116. FIG. 3C is a high level schematic example of target design 100 and printed target 110, according to some embodiments of the invention. Metrology target design 100 may comprise a periodic structure produced in a resist layer only and having a design rule pitch. Metrology target design 100 may be composed of a plurality of printed elements 105 having critical dimensions (e.g., $CD_1$, possibly multiple different CD's) above a printable threshold and a plurality of non-printed elements 106 having critical dimensions (e.g., $CD_2$, possibly multiple different CD's) below a printable threshold. Metrology targets 110 printed according to designs 100 comprise printed lines 115 and non-printed lines 116. Certain embodiments comprise metrology measurements of targets 110, which comprise a zeroth order diffraction signal and only one first order diffraction signal at a pupil plane of a metrology tools detector. The metrology measurement may be used to measure scanner aberrations. In an exemplary design, simulated PPE was less than 0.1 nm, and overlay measurement accuracy reached 0.2 nm (in contrast to prior art PPE in the range of 1-3 nm).

In certain embodiments, target designs 100 may comprise (i) defining a coarse target pitch according to the requirements for target contrast (measurability) and process compatibility (no large empty areas), (ii) considering the coarse pitch as a periodic row of device-like structures with design rule pitch, and (iii) changing the CD values in the fine pitches corresponding to empty areas in the printed pattern to be below the lithographic threshold needed for these lines to be printed. Certain embodiments comprise a straightforward extension of the disclosed approach to two dimensional target designs with equivalent or different pitches in perpendicular directions. For example, the fine pitches in X and Y directions may be designed to correspond to the pitches of the device in those directions.

Figure 4:
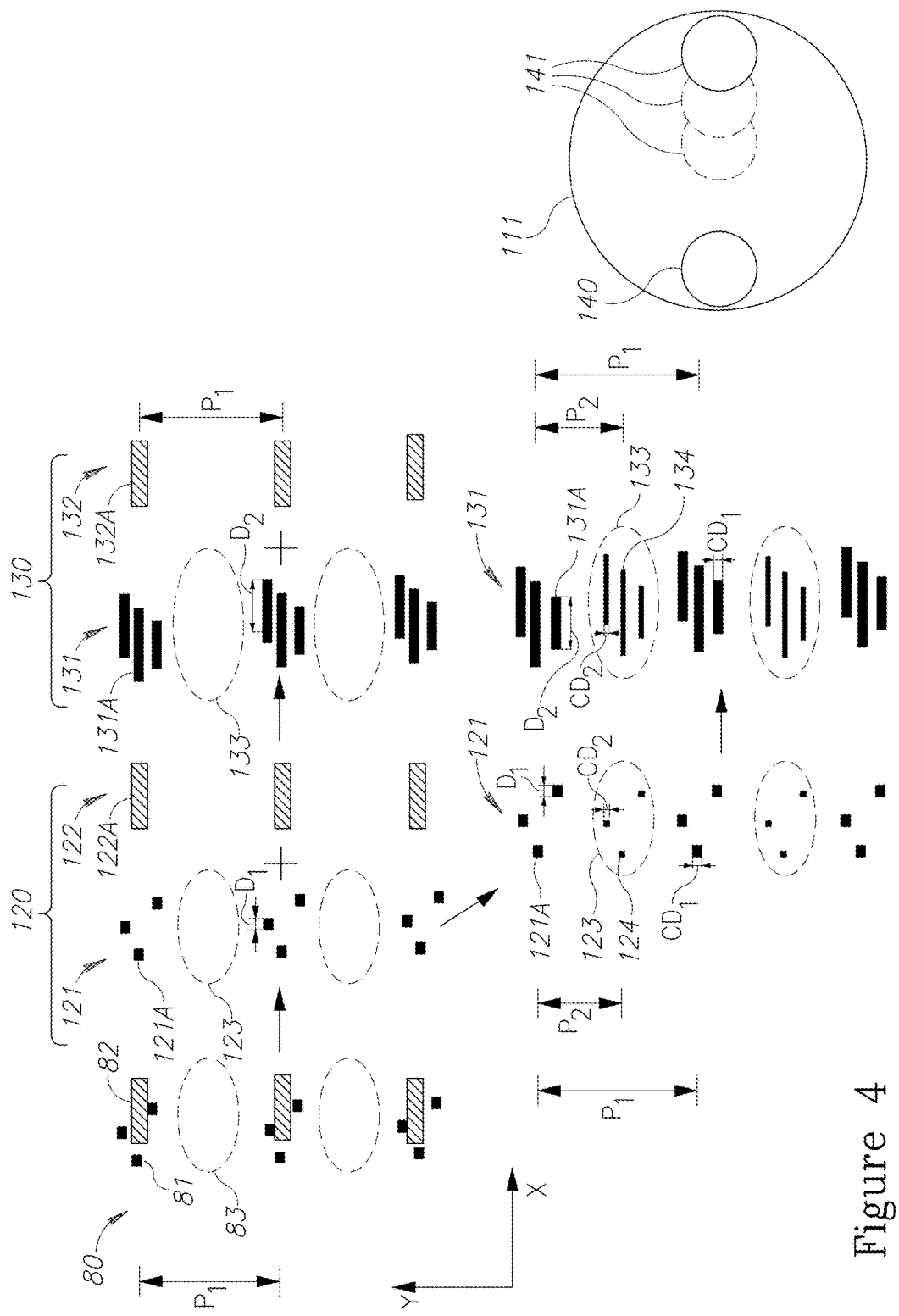
FIG. 4 is a high level schematic illustration of metrology overlay target designs and of a quasi two beam imaging approach, according to some embodiments of the invention.

FIG. 4 is a high level schematic illustration of metrology overlay target designs 120, 130 and of a quasi two beam imaging approach, according to some embodiments of the invention. It is noted that target pitches are shown only in one direction (marked X) for simplicity, and in a non-limiting manner. The following design of targets may also be carried out along both X and Y directions. Given a specified device design 80 having at least two different geometric elements 81, 82 (illustrated schematically), metrology overlay targets 120 may comprise at least two target cells 121, 122 having structures 121A, 122A (in cells 121, 122, respectively) that relate to different geometric elements 81, 82 (respectively) identified in given specified device design 80. In certain embodiments, target structures 121A, 122A may comprise at least one of repetition and symmetrization of corresponding geometric elements 81, 82 (respectively).

In certain embodiments, one dimension in at least one of the target structures may comprise the corresponding geometric element having one dimension thereof increased (e.g., from $D_1$ to $D_2$). Increasing one dimension may be carried out to enhance the contrast of the target while maintaining its design rule compatibility and small PPE resulting from device resemblance. The enhanced contrast may be selected to enable overlay measurements. For example, the illustrated case target structure 131A is based on corresponding geometric element 81 (e.g., via holes, which are too small to provide adequate contrast for overlay measurements) and is elongated with respect to corresponding geometric element 81. Target structure 131A in cell 131 may be modified with respect to corresponding geometric element 81 while another target structure 132A (in cell 131 of target 130) may be similar to corresponding geometric element 82 or comprise a modified version thereof without dimensional change.

Target designs 120, 130 may thus comprise real device-like structures (e.g., 121A, 122A, 131A, 132A) having a relatively large pitch (e.g., $P_1$) in vertical direction Y, which is e.g., larger than twice of minimal design rule pitch (MDRP)−$P_1$>2MDRP). As such cases, target measurement may yield at least three diffraction orders within the scanner objective lens pupil. Any change of the printed pattern (e.g., CD, form or any other parameter) may change the amplitudes and phases of the diffraction orders which in turn effectively change the effect of scanner aberrations on the final position of the projected image. Accordingly, any attempt to improve target contrast by modifying the printed structures could be associated with the appearance of uncontrollable pattern placement error. This problem can be solved by using a quasi-two-beam imaging approach as described above and as illustrated by diffraction pattern 111 that is illustrated in FIG. 4 at the pupil plane, that comprises a zeroth diffraction order beam 140 (corresponding to one of the peaks in the diffraction pattern illustrated in FIG. 2) and a single first order beam 141 (plus first order or minus first order) that represent the signals from the fine pitches that are close to the minimal design rule pitch. The signals denoted by broken lines denote the possible range of the fine pitch between one MDRP and two MDRP which correspondingly results in the first order beam being between the center of the pupil plane (when the zeroth order beam is at the edge of the pupil plane, as a non-limiting example) and the opposite edge of the pupil plane. The quasi-two-beam imaging approach deliberately uses a fine pitch which produces from each illumination pole only a zeroth diffraction order and one of the first order diffraction orders within the pupil plane (to satisfy this condition the fine pitch is selected to be between minimal design rule pitch and twice the minimal design rule pitch). It is noted that in case the device pitch is larger than twice the minimal design rule pitch, additional (one or more) unprinted structures may be added to the design, to make the resulting fine pitch be less than twice the design rule pitch. As an example, a new half pitch ($P_2$) may be introduced to be less than twice design rule pitch, by adding intermediate filling structures which are not printed, similarly to the approach illustrated in FIGS. 2 and 3A-C above. The intermediate filling structures then provide a fine segmentation pitch that is less than twice design rule pitch ($P_2$<2MDRP). In case the original pitch ($P_1$) is a few times the minimal design rule pitch, more than one additional unprinted intermediate filling structure may be added to reach a pitch $P_2$<2MDRP.

In certain embodiments, target design files and/or target lithography masks may comprise a plurality of filling structures 124, 134 that relate to corresponding geometric elements 81. Filling structures 124, 134 have a characteristic dimension (e.g., $CD_2$) that is below a production threshold, and are placed at spaces 123, 133 in the target design to yield a quasi-periodic structure with pitch $P_2$ instead of pitch $P_1$ and thus to satisfy the quasi two beam imaging condition explained above and illustrated in pupil plane 111 in FIG. 4. Moreover, the introduction of filling structures 124, 134 to remove gaps 123, 133 from the target design yield similar pattern placement errors for the metrology target and the device. Moreover, it is noted that in accordance with quasi two beam imaging principle, this pattern placement error corresponds to any periodic structure with fine pitch $P_2$. Filling structure 124, 134 together with printed designed device structure constitute a quasi-periodic structure with pitch $P_2$ instead of pitch $P_1$ which was designed for device. Filling structures 124, 134 may be incorporated in the design files and masks of any of target cells 121, 122, 131, 132.

Moreover, in certain embodiments, device design 80 (and corresponding masks) may be modified to comprise a plurality of filling elements that relate to at least one of identified geometric element(s) 81, 82 in device design 80, and are placed at spaces 83 in device design 80 at a pitch ($2P_2$) between a device pitch and twice the device pitch. Filling elements may have a characteristic dimension (e.g., $CD_2$) that is below a production threshold, to prevent or reduce pattern placement errors in the production of the devices. Adding filling elements to device design 80 may allow printing of all device structures having the same pitch with the same controllable placement shift as well as allow modification of such device targets to "proxy" OVL targets measurable by OVL tools and having the same pattern placement as the real devices. The above described procedure may be extended to two dimensional target designs straightforwardly, with equivalent or different pitches in perpendicular directions.

An additional application of small PPE target designs 120, 130 may be the measurement of scanner asymmetric aberrations. Namely, when a periodic target with pitch less than twice of minimal design rule pitch is printed, it provides only two diffraction orders within the pupil plane of scanner's objective lens (zeroth diffraction order and one of the first diffraction orders). In this case the pattern placement shift is determined by phase difference provided by scanner's lens asymmetric aberrations in the positions of zero order and one of the ±1 diffraction orders in the pupil (depending on position of illumination pole), i.e., as expressed in Equation 1.

$$PPE = \frac{\text{Pitch}}{2\pi}[\phi(x_0) - \phi(x_1)], \text{ where } x_1 = x_0 + \frac{\lambda}{n \cdot \text{Pitch}} \quad \text{Equation 1}$$

Using a set of gratings with pitches {MDRP<$p_i$<2·MDRP, i=1, . . . , N+1} a set of N independent equations (like Equation 1) corresponding to measured OVL between two cells with gratings having different pitches, for example, for i=1, . . . , N, Equations 2:

$$OVL_i = PPE_{i+1} - PPE_i = \quad \text{Equation 2}$$

$$\frac{p_{i+1}}{2\pi}\left[\phi(x_0) - \phi\left(x_0 + \frac{\lambda}{n \cdot p_{i+1}}\right)\right] - \frac{p_i}{2\pi}\left[\phi(x_0) - \phi\left(x_0 + \frac{\lambda}{n \cdot p_i}\right)\right]$$

Now approximating asymmetric aberrations distribution in the pupil with a set of N asymmetric Zernike polynomials $$\phi(x) = 2\pi \sum_{k=1}^{N} A_k \cdot f_k(x)$$

we get a final set of Equations 3:

$$OVL_i = \sum_{k=1}^{N} A_k \cdot \left[p_{i+1} \cdot \left[f_k(x_0) - f_k\left(x_0 + \frac{\lambda}{n \cdot p_{i+1}}\right)\right] - \right.\quad \text{Equations 3}$$

$$\left. p_i \cdot \left[f_k(x_0) - f_k\left(x_0 + \frac{\lambda}{n \cdot p_i}\right)\right]\right], i = 1, \ldots, N$$

The amplitudes of Zernike polynomials can be calculated from Equations 3. The number of cells is a number of Zernike polynomials used for approximation of asymmetric aberrations distribution within the pupil plus one.

The scenario described above implies printing of gratings with small pitches <200 nm which are not resolved by OVL tools. However, since target designs 100, 120, 130 are measurable with OVL tools and provide the same pattern placement shifts as grating with pitches corresponding to their unresolved fine pitches, these target designs also enable measurement of asymmetric scanner aberrations. For example, targets 100, 120, 130 may be printed only in the resist layer, and hence the requirement to process compatibility may be relaxed.

Certain embodiments may comprise metrology measurements of targets 120, 130 which comprise a zeroth order diffraction signal and only one first order diffraction signal at a pupil plane of a metrology tools detector, the metrology measurement may be used to measure scanner aberrations.

Advantageously, the suggested approach allows design of "proxy" OVL targets having the same placements as rows of real devices but measurable with optical tools. The main principle of the design may be extended to any type of devices, including 2D structures like contact holes and including 2D structures with equal or different periods in orthogonal directions.

The new approach also implies that real device structures having a pitch that is larger than twice the minimal design rule pitch could be printed using intermediate non-printable assist features providing a quasi-periodic pattern with a pitch that is less than twice the minimal design rule pitch.

Furthermore, the suggested approach for "proxy" target design allows using the OVL technique for measurement of amplitudes of scanner asymmetric aberrations, as it provides a small pattern placement error.

Advantageously, the new target design concept allows the design of contrast and process compatible OVL targets having the same pattern placement as periodical rows of real devices. Accordingly, the OVL information obtained with these new targets becomes much more relevant for OVL correction for devices. As a by-product, usage of these targets may significantly improve matching between CDSEM (critical dimension scanning electron microscopy), OVL measurements on devices and optical OVL measurement on "proxy" targets—a matching which provides the main criterion for optical tools accuracy.

The new approach may also be used to improve the control on placement error of real devices and improve the device designs, for devices having pitches larger than twice of minimal design rule pitch.

Figure 5:
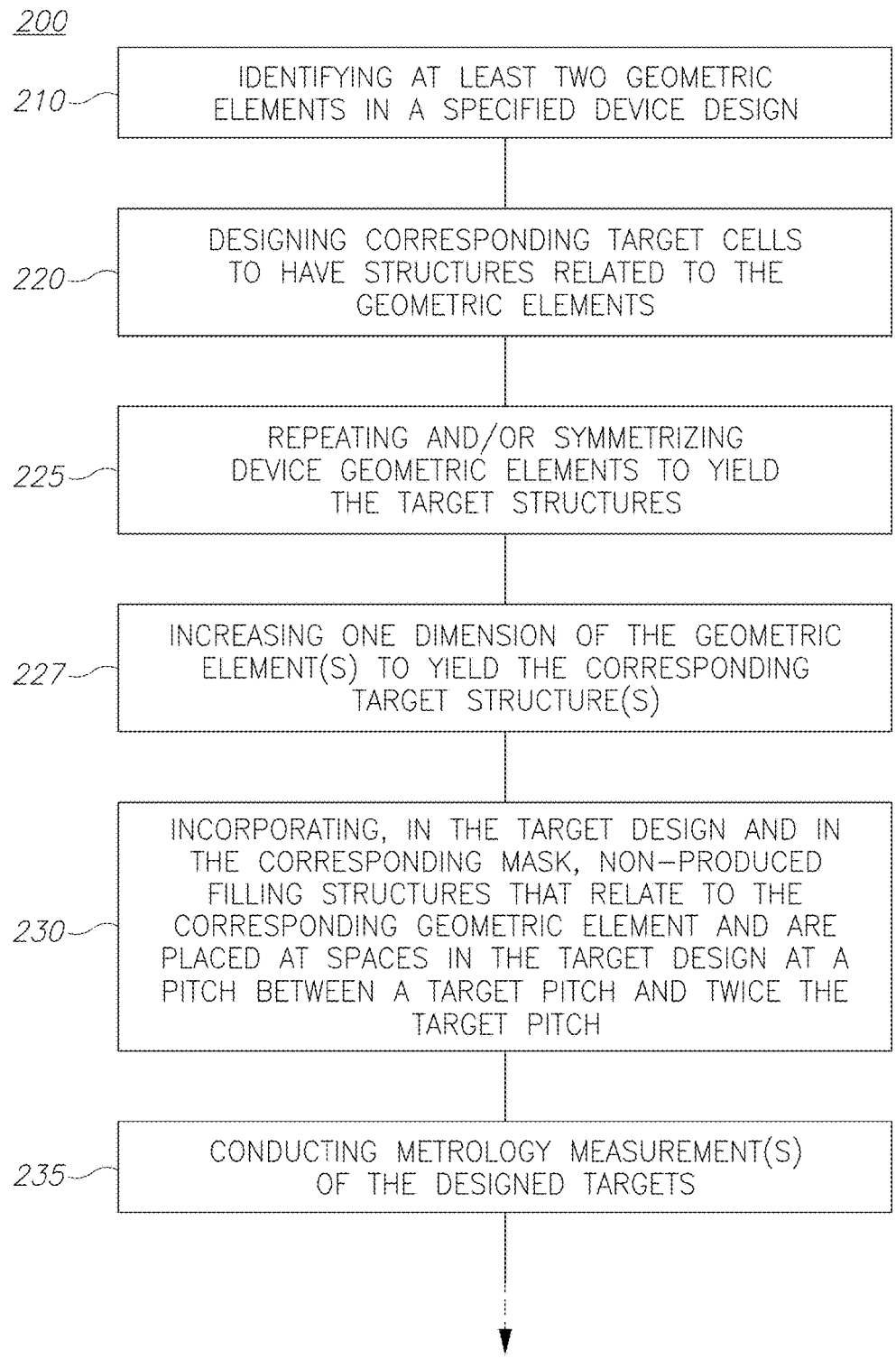
FIG. 5 is a high level flowchart illustrating a method, according to some embodiments of the invention.

FIG. 5 is a high level flowchart illustrating a method 200, according to some embodiments of the invention. Method 200 may be at least partially implemented by at least one computer processor, e.g., in a metrology module for designing targets and/or devices. Certain embodiments comprise computer program products comprising a computer readable storage medium having a computer readable program embodied therewith and configured to carry out the relevant stages of method 200. Certain embodiments comprise target and device design files of respective targets and devices designed by embodiments of method 200.

Method 200 may comprise identifying at least two geometric elements in a specified device design (stage 210), and designing corresponding at least two target cells of an overlay metrology target to have structures related to the at least two geometric elements (stage 220). The relation between the target structures and the geometric elements comprises at least one of repetition and symmetrization of the geometric elements to yield the target structures and method 200 may comprise repeating and/or symmetrizing device geometric elements to yield the target structures (stage 225).

In certain embodiments, method 200 may comprise increasing one dimension of at least one of the geometric elements to yield the corresponding at least one target structure (stage 227).

In certain embodiments, method 200 may comprise incorporating, in a target design of at least one of the cells and in a corresponding mask, a plurality of filling structures that relate to the corresponding geometric element and have a characteristic dimension that is below a production threshold, the filling structures placed at spaces in the design at a pitch between a target pitch and twice the target pitch (stage 230).

Method 200 may further comprise conducting metrology measurement(s) of the designed targets (stage 235) and possibly using the designed target(s) to measure scanner aberrations (stage 237).

In certain embodiments, method 200 may comprise incorporating, in a device design and in a corresponding mask, a plurality of filling elements that relate to the corresponding geometric element and have a characteristic dimension that is below a production threshold, the filling elements placed at spaces in the design at a pitch between a device pitch and twice the device pitch (stage 240). For example, method 200 may comprise modifying the specified device design and the corresponding mask to include filling elements that relate to the corresponding geometric elements and have a characteristic dimension that is below a production threshold, the filling elements placed at spaces in the device design at a pitch between a device pitch and twice the device pitch.

In certain embodiments, method 200 may comprise applying the design principles in two dimensions of the targets and/or devices (stage 250).

In certain embodiments, method 200 may comprise configuring the targets to yield quasi-two-beam imaging comprising a zeroth order beam and only one of the first order beams (stage 260).

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method, comprising:
   receiving a design-rule pitch associated with a pitch of device features along a measurement direction;
   receiving a course pitch providing a selected target contrast when measured by a metrology tool;
   generating a lithography mask design including a metrology target, the metrology target including target features distributed with the design-rule pitch along a measurement direction, wherein dimensions of a first subset of the target features are selected to be above a printing threshold of a lithography tool for fabricating printed elements on samples based on illuminating a pattern mask such that the first subset of target features are printed by the lithography tool, wherein dimensions of a second subset of the target features are selected to be below the printing threshold such that the second subset of features are not printed by the lithography tool, wherein the first subset of target features and the second subset of target features are arranged to provide a pattern of printed elements separated by the course pitch; and
   exposing, with the lithography tool, at least one sample based on a pattern mask with the lithography mask design to generate a metrology target on the sample including printed elements separated by the course pitch.

2. The method of claim 1, wherein the target features are arranged in a pattern associated with geometric elements of a device design, wherein shapes of the target features correspond to shapes of the corresponding geometric elements modified to be symmetric.

3. The method of claim 1, wherein shapes of the target features correspond to shapes of the corresponding device features modified to be extended along the measurement direction to provide the selected target contrast.

4. The method of claim 1, wherein the metrology target of the lithography mask design includes target features arranged in two or more cells, wherein the target features within each of the two or more cells correspond to a different geometric element of a device design.

5. The method of claim 1, further comprising:
   measuring aberrations of the lithography tool based on measurements of the metrology target on the sample fabricated by the lithography tool.

6. A lithography mask comprising:
   a metrology target, the metrology target including target features distributed with a design-rule pitch along a measurement direction associated with a pitch of device features along the measurement direction, wherein dimensions of a first subset of the target features are selected to be above a printing threshold of a lithography tool for fabricating printed elements on samples based on illuminating a pattern mask such that the first subset of target features are printed by the lithography tool, wherein dimensions of a second subset of the target features are selected to be below the printing threshold such that the second subset of features are not printed by the lithography tool, wherein the first subset of target features and the second subset of target features are arranged to provide a pattern of printed elements separated by a course pitch providing a selected target contrast when measured by a metrology tool, wherein the lithography tool exposes at least one sample based on a pattern mask with the lithography mask design to generate a metrology target on the sample including printed elements separated by the course pitch.

7. The lithography mask of claim 6, wherein the target features are arranged in a pattern associated with geometric elements of a device design wherein the geometric elements of the device design are further distributed with a device pitch greater than twice the device-rule pitch along an orthogonal direction to the measurement direction, wherein the first subset of target features and the second subset of target features are arranged with a target pitch less than twice the device-rule pitch along the orthogonal direction and are further arranged to provide a pattern of printed elements separated by the additional pitch along the orthogonal direction when exposed by the lithography tool.

8. The lithography mask of claim 7, wherein the target pitch is selected to limit diffraction in a pupil plane of the lithography tool to two diffracted orders.

9. The lithography mask of claim 6, wherein the metrology target of the lithography mask design includes target features arranged in two or more cells, wherein the target features within each of the two or more cells correspond to a different geometric element of a device design.

10. A lithography system comprising:
a lithography mask design sub-system configured to be coupled to a lithography tool for fabricating printed elements on samples based on illuminating a pattern mask, wherein the lithography mask design sub-system includes one or more processors that are configured to execute program instructions causing the one or more processors to:
receive a design-rule pitch associated with a pitch of device features along a measurement direction;
receive a course pitch providing a selected target contrast when measured by a metrology tool; and
generate a lithography mask design including a metrology target, the metrology target including target features distributed with the design-rule pitch along a measurement direction, wherein dimensions of a first subset of the target features are selected to be above a printing threshold of the lithography tool such that the first subset of target features are printed by the lithography tool, wherein dimensions of a second subset of the target features are selected to be below the printing threshold such that the second subset of features are not printed by the lithography tool, wherein the first subset of target features and the second subset of target features are arranged to provide a pattern of printed elements separated by the course pitch, wherein the lithography tool exposes at least one sample based on a pattern mask with the lithography mask design to generate a metrology target on the sample including printed elements separated by the course pitch.

11. The lithography system of claim 10, wherein the target features are arranged in a pattern associated with geometric elements of a device design.

12. The lithography system of claim 11, wherein shapes of the target features correspond to shapes of the corresponding geometric elements modified to be symmetric.

13. The lithography system of claim 12, wherein shapes of the target features correspond to shapes of the corresponding device features modified to be extended along the measurement direction to provide the selected target contrast.

14. The lithography system of claim 11, wherein the geometric elements of the device design are further distributed with a device pitch greater than twice the device-rule pitch along an orthogonal direction to the measurement direction, wherein the first subset of target features and the second subset of target features are arranged with a target pitch less than twice the device-rule pitch along the orthogonal direction and are further arranged to provide a pattern of printed elements separated by the additional pitch along the orthogonal direction when exposed by the lithography tool.

15. The lithography system of claim 14, wherein the target pitch is selected to limit diffraction in a pupil plane of the lithography tool to two diffracted orders.

16. The lithography system of claim 15, wherein the two diffracted orders comprise:
a zero-order diffraction beam and a first order diffraction beam.

17. The lithography system of claim 10, wherein the metrology target of the lithography mask design includes target features arranged in two or more cells, wherein the target features within each of the two or more cells correspond to a different geometric element of a device design.

* * * * *